United States Patent [19]

Sakaguchi et al.

[11] Patent Number: 4,883,739
[45] Date of Patent: Nov. 28, 1989

[54] LIGHT-SENSITIVE RESIN COMPOSITION WITH 1,2-NAPHTHOQUINONE DIAZIDE COMPOUND HAVING SPIROBICHROMAN OR SPIROBIINOANE RING

[75] Inventors: Shinji Sakaguchi; Shiro Tan, both of Shizuoka, Japan

[73] Assignee: Fuji Photo Film Co., Ltd., Kanagawa, Japan

[21] Appl. No.: 245,190

[22] Filed: Sep. 16, 1988

[30] Foreign Application Priority Data

Sep. 17, 1987 [JP] Japan ................. 62-233292

[51] Int. Cl.$^4$ ................. G03C 1/54
[52] U.S. Cl. ................. 430/192; 430/191; 430/193; 430/165; 430/326; 534/556; 534/557
[58] Field of Search ............. 430/193, 190, 191, 192, 430/345, 962, 165, 326; 534/556, 557

[56] References Cited

U.S. PATENT DOCUMENTS

| | | | |
|---|---|---|---|
| 3,652,285 | 3/1982 | Delzenne et al. | 430/190 |
| 3,660,094 | 5/1972 | Poot | 430/345 |
| 3,730,734 | 5/1973 | Delzenne | 430/191 |
| 4,028,111 | 6/1977 | Iwasaki et al. | 430/345 |
| 4,052,218 | 10/1977 | Samat et al. | 430/345 |
| 4,237,207 | 12/1980 | Ceintrey | 430/345 |
| 4,267,961 | 5/1981 | Martin et al. | 438/480 |
| 4,385,111 | 5/1983 | Nakamura et al. | 430/551 |
| 4,444,869 | 4/1984 | Chonan et al. | 430/191 |
| 4,594,306 | 6/1986 | Stahlhofen et al. | 430/191 |
| 4,626,492 | 12/1986 | Eilbeck | 430/191 |

FOREIGN PATENT DOCUMENTS 148787 7/1985 Japan ................. 430/193

*Primary Examiner*—Charles L. Bowers, Jr.
*Attorney, Agent, or Firm*—Sughrue, Mion, Zinn, Macpeak & Seas

[57] ABSTRACT

A light-sensitive resin composition comprising a light-sensitive substance represented by the formula (A) shown below and an alkali-soluble resin:

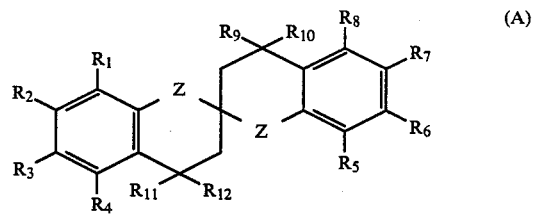

(A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group, -OD, or

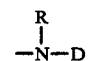

(wherein R is hydrogen, or an alkyl group, and D is a 1,2-naphthoquinonediazido-5-sulfonyl group or a 1,2-naphthoquinonediazido-4-sulfonyl group);

$R_9$ to $R_{12}$ are independently hydrogen or a lower alkyl group; and

Z is oxygen or a single bond; provided that at least one of $R_1$ to $R_8$ is -OD or

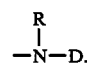

3 Claims, No Drawings

LIGHT-SENSITIVE RESIN COMPOSITION WITH 1,2-NAPHTHOQUINONE DIAZIDE COMPOUND HAVING SPIROBICHROMAN OR SPIROBIINOANE RING

FIELD OF THE INVENTION

The present invention relates to a light-sensitive resin composition comprising an alkali soluble resin and a specific light sensitive substance. The light-sensitive resin composition is sensitive to radiation such as ultraviolet rays, far ultraviolet rays, X rays, electron rays, molecular beams, γ rays, and synchrotron radiation. Specifically the present invention is concerned with a photoresist. More specifically it is concerned with a photoresist composition for fine fabrication, having high resolving power and sensitivity, and also good storage stability.

The photoresist can be coated on a semiconductor wafer or a substrate such as glass, ceramics, and metal. Thereafter, the coating is heated and dried. A circuit pattern, for example, is baked on the coating through an exposure mask by irradiating with ultraviolet rays and the coating is developed to obtain a positive image pattern. Further, by applying etching using the above obtained positive image pattern as a mask, the corresponding pattern is formed on the substrate. Typical applications include the production of semiconductors such as integrated circuits (IC) and circuit substrates for liquid crystals, thermal heads and the like, as well as other photofabrications.

BACKGROUND OF THE INVENTION

As a positive type photoresist composition, a composition containing an alkali-soluble resin and a naphthoquinone diazide compound as a light-sensitive substance is generally used. For example, a composition comprising a novolak type phenol resin and a naphthoquinonediazide-substituted compound is described in, for example, U.S. Pat. Nos. 3,666,473, 4,115,128 and 4,173,470, and a composition comprising a novolak resin of cresol-formaldehyde and trihydroxybenzophenone-1,2-naphthoquinonediazidesulfonic acid estesr, which is most typical, is described in L. F. Thompson, *Introduction to Microlithography*, ACS Publishing Co., Ltd., No. 219. pp. 112-121.

A novolak resin as a binder is particularly useful because it is soluble in an aqueous alkali solution without swelling and in using the formed image pattern as a mask for etching, exhibits high resistance especially against plasma etching. A naphthoquinonediazide compound as a light-sensitive substance acts as a dissolution-preventing agent which reduces the solubility of the novolak resin, but when decomposed by irradiation with light, produces an alkali-soluble substance and increases the alkali solubility of the novolak resin. Because of this large change in properties with light, the naphthoquinonediazide compound is particularly useful as a light-sensitive substance for the positive-type photoresist.

From the above viewpoint, a number of positive type photoresists containing a novolak resin and a naphthoquinone diazide-base light-sensitive substance have been developed and put into practical use, and satisfactory results have been obtained in the fabrication of line widths up to about 1.5 to 2 μm.

With an increase in the degree of integration in integrated circuits, the fabrication of fine patterns having a line width of not more than 1 μm has been needed in the production of substrates for semiconductors such as super LSI and so on. In this application, there is needed a photoresist which has a high resolving power, a high pattern reproducing accuracy permitting accurate copying of the shape of an exposure mask, and a high sensitivity from the viewpoint of high productivity, and further which is excellent in storage stability.

An attempt to increase a quinonediazide light-sensitive group content has been made to obtain a high resolving power, JP-A No. 60-158440, for example, describes a method using a light-sensitive substance having a high triester content. (The term "JP-A" as used herein means an "unexamined published Japanese patent application" .) JP-A No. 61-118744 describes an attempt to increase the number of quinonediazide light-sensitive groups contained in the molecule of a light-sensitive substance.

These light-sensitive substances, however, are insoluble in commonly used solvents, or even if soluble, form a precipitated material during the storage of the photoresist composition, causing problems at the photofabrication step or device fabrication step and a reduction in yield. In order to prevent the precipitation of a light-sensitive substance, JP-A No. 61-260239 describes a method of adding organic solvents having a solubility parameter of 11 to 12. However, since a solvent such as dimethylsulfoxide is used, the storage stability of the resist composition is poor, and sensitivity and resolving power markedly vary with a lapse of days. Thus the above photoresist cannot meet the requirements as described above.

SUMMARY OF THE INVENTION

An object of the present invention is to provide a photoresist composition having a high resolving power.

Another object of the present invention is to provide a photoresist composition capable of accurately reproducing mask dimensions over a wide range of photomask line widths.

Another object of the present invention is to provide a photoresist composition capable of producing a resist pattern having a high aspect ratio in the cross-sectional form in a pattern having a line width of not more than 1 μm.

Another object of the present invention is to provide a photoresist composition capable of forming a pattern having a shape such that the side wall of the cross-section of the pattern is nearly vertical.

Another object of the present invention is to provide a photoresist composition having a broad developing latitude.

Another object of the present invention is to provide a photoresist composition which is soluble in commonly used solvents and which is excellent in storage stability and thus does not produce any precipitate during its long-term storage.

Another object of the present invention is to provide a photoresist composition which produces a resist image having excellent heat resistance.

The present invention relates to a light-sensitive resin composition comprising a light-sensitive substance represented by the formula (A) shown below and an alkali-soluble resin:

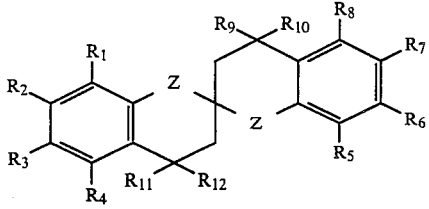 (A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group, -OD or

(wherein R is hydrogen, or an alkyl group, and D is a 1,2-naphthoquinonediazide-5-sulfonyl group or a 1,2-naphthoquinonediazide-4-sulfonyl group);

$R_9$ to $R_{12}$ are independently hydrogen or a lower alkyl group; and

Z is oxygen or a single bond; provided that at least one of $R_1$ to $R_8$ is -OD or

DETAILED DESCRIPTION OF THE INVENTION

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each alkyl substituent having 1 to 4 carbon atoms, such as dimethylamino, diethylamino, dipropylamino, di-isopropylamino, di-n-butylamino, di-isobutylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl or tert-butyl.

In the formula (A) above, $R_1$ to $R_8$ are preferably a hydrogen atom, a hydroxy group or a -D group wherein D is as defined above, and $R_9$ to $R_{12}$ are preferably a hydrogen atom or a methyl group. R is preferably an alkyl group having 1 to 4 carbon atoms, such as a methyl ethyl, n-propyl, iso-propyl, n-butyl, iso-butyl, sec-butyl or t-butyl group.

The compounds represented by the formula (A) can be easily prepared by condensing spirobiindane or spirobichroman derivatives represented by the formula (B) shown below with 1,2-naphthoquinonediazide-5-sulfonyl chloride or 1,2-naphthoquinonediazide-4-sulfonyl chloride or a mixture thereof.

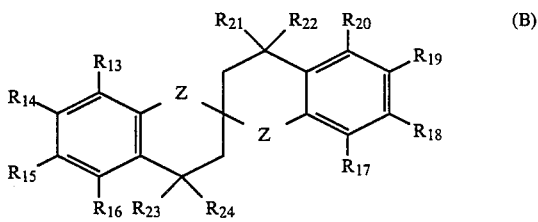 (B)

wherein $R_{13}$ to $R_{20}$ are independently hydrogen, a hydroxy group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxy group, a cyano group, a nitro group, an acyl group, an alkyloxycarbonyl group, an aryloxycarbonyl group, or an acyloxy group;

$R_{21}$ to $R_{24}$ are independently hydrogen or a lower alkyl group; and

Z is oxygen or a single bond, provided that at least one of $R_{13}$ to $R_{20}$ is a hydroxyl group, an amino group or a monoalkylamino group.

The compounds represented by the formula (B) can be prepared by, for example, the method described in W. Baker et al., *J. Chem. Soc.*, p. 195, 1939.

Representative examples of the compounds represented by the formula (B) are shown below, although the present invention is not limited thereto.

3,3,3',3'-Tetramethyl-1,1'-spirobiindane-4,6,7,4',6', 7'-hexol, 3,3,3',3'-Tetramethyl-1,1'-spirobiindane-5,6,7,5',6',7'-hexol, 3,3,3',3'-Tetramethyl-1,1'-spirobiindane-5,6,5',6'-tetrol, 3,3,3',3'-Tetramethyl-1,1'-spirobiindane-6,7,6',7'-tetrol, 5,5'-Di-tert-butyl-3,3,3',3'-tetramethyl-1,1'-spirobiindane-6,7,6',7'-tetrol, 5-Tert-butyl-3,3,3',3'tetramethyl-1,1'-spirobiindane-6,7,6',7'-tetrol, 3,3,3',3'-Tetramethyl-1,1'-spirobiindane-5,6,6'-triol, 3,3,3',3'-Tetramethyl-1,1'-spirobiindane-6,6'-diol, 5,5'-Di-tert-butyl 3,3,3',3'-tetramethyl-1,1'-spirobiindane-6,6'-diol, 3,3,3',3'-Tetramethyl-1,1'-spirobiindane-5,5'-diol, 7,7'-Dibromo-3,3,5,5',3',5'-hexamethyl-1,1'-spirobiindane-6,6'-diol, 5,5'-Diamino-3,3,3',3'-tetramethyl-1,1'-spirobiindane, 4,4,4',4'-Tetramethyl-2,2'-spirobichroman-6,7,6',7'-tetrol, 7,7'-Dichloro-4,4,4',4'-tetramethyl-2,2'-spirobichroman-6,6'-diol, 5,5'-Dichloro-4,4,7,4',4',7'-hexamethyl-2,2'-spirobichroman-6,6'-diol, 6',6'-t-Butyl-4,4,4',4'-tetramethyl-2,2'-spirobichroman-7,7'-diol.

The esterification reaction of the compounds of the formula (B) and 1,2-naphthoquinonediazide-5-sulfonyl chloride or 1,2-naphthoquinonediazide-4-sulfonyl chloride can be carried out by a conventional method. That is, given amounts of spirobiindane or spirobichroman of the formula (B), 1,2-naphthoquinonediazide-5-sulfonyl chloride or 1,2-naphthoquinonediazide-4-sulfonyl chloride, and a solvent such as dioxane, acetone, methyl ethyl ketone and the like are placed in a flask and condensed by adding a basic catalyst such as sodium hydroxide, sodium carbonate, sodium hydrogencarbonate, triethylamine and the like. The product thus obtained is washed with water and then purified and dried. By the above method, the light-sensitive substance represented by the formula (A) can be prepared.

In the light sensitive substance represented by the formula (A), the total number of -O-D and

contained in the molecule is preferably at least 2, and particularly preferably at least 4.

Representative examples of the light-sensitive substances of the formula (A) are shown below, although the present invention is not limited thereto.

3,3,3',3'-Tetramethyl-1,1'-spirobiindane-5,6,7,5',6',7'-hexol hexa-1,2-naphthoquinonediazide-5-sulfonate, 3,3,3',3'-Tetramethyl-1,1'-spirobiindane-5,6,7,5',6',7'-hexol penta-1,2-naphtoquinonediazide-5sulfonate, 3,3,3',3'-Tetramethyl-1,1'-spirobiindane-5,6,7,5',6',7'-hexol tetra-1,2-naphthoquinonediazide-5-sulfonate, 3,3,3',3'-Tetramethyl-1,1'-spirobiindane-5,6,7,5',6',7'-hexol tri-1,2-naphthoquinonediazide-5-sulfonate, 5-Tert-butyl-3,3,3',3'-tetramethyl-1,1'-spirobiindane-6,7,6',7'-tetrol tetra-1,2-naphthoquinonediazide-5-sulfonate, 3,3,3',3'-Tetramethyl-1,1'-spirobiindane-5,6,7,5',6',7'-hexol di-1,2-naphtoquinonediazide-5-sulfonate, 3,3,3',3'-Tetramethyl-1,1'-spirobiindane-5,6,7,5',6',7'-hexol mono-1,2-naphthoquinonediazide-5-sulfonate, 3,3,3',3'-Tetramethyl-1,1'-spirobiindane-4,6,7,4',6',7'-hexol hexa-1,2-naphthoquinonediazide-5-sulfonate, 3,3,3',3'-Tetramethyl-1,1'-spirobiindane-4,6,7,4',6',7'-hexol tetra-1,2-naphthoquinonediazide-5-sulfonate, 3,3,3',3'-Tetramethyl-1,1'-spirobiindane-4,6,7,4',6',7'-hexol tri-1,2-naphthoquinonediazide-5-sulfonate, 3,3,3',3'-Tetramethyl-1,1'-spirobiindane-5,6,5',6'-tetrol tetra-1,2-naphthoquinonediazide-5sulfonate, 3,3,3',3'-Tetramethyl-1,1'-spirobiindane-5,6,5',6'-tetrol tri-1,2-naphthoquinonediazide-5-sulfonate, 3,3,3',3'-Tetramethyl-1,1'-spirobiindane-6,7,6',7'-tetrol tetra-1,2-naphthoquinonediazide-5-sulfonate, 3,3,3',3'-Tetramethyl-1,1'-spirobiindane-6,7,6',7'-tetrol tri-1,2-naphthoquinonediazide-5-sulfonate, 5,5'-Di-tert-butyl-3,3,3',3'-tetramethyl-1,1'-spirobiindane-6,7,6',7'-tetrol tetra-1,2-naphthoquinonediazide-5-sulfonate, 5,5'-Di-tert-butyl-3,3,3',3'-tetramethyl-1,1'-spirobiindane-6,7,6',7'-tetrol tri-1,2-naphthoquinonediazide-5-sulfonate, 5-Tert-butyl-3,3,3',3'-tetramethyl-1,1'-spirobiindane-6,7,6',7'-tetrol di-1,2-naphthoquinonediazide-5-sulfonate, 3,3,3',3'-Tetramethyl-1,1'-spirobiindane-5,6,6'triol tri-1,2-naphthoquinonediazido-5-sulfonate, 3,3,3',3'-Tetramethyl-1,1'-spirobiindane-6,6'-diol di-1,2-naphthoquinonediazide-5-sulfonate, 5,5'-Di-tert-butyl-3,3,3',3'-tetramethyl-1,1'-spirobiindane-6,6'-diol di-1,2-naphthoquinonediazide-5-sulfonate, 3,3,3',3'-Tetramethyl-1,1'-spirobiindane-5,5'-diol di-1,2-naphthoquinonediazide-5-sulfonate, 3,3,3',3'-Tetramethyl-1,1'-spirobiindane-6,6'-diol di-1,2-naphthoquinonediazide-5-sulfonate, 7,7'-Dibromo-3,3,5,5',3',5'-hexamethyl-1,1'-spirobiindane-6,6'diol di-1,2-naphthoquinonediazide-5-sulfonate, 1,1-Spirobiindane-5,5'-diol di-1,2-naphthoquinonediazido-5-sulfonate, 5,5'-Diamino-3,3,3',3'-tetramethyl-1,1'-spirobindane-1,2-naphthoquinonediazide-5-sulfonic acid diamide, 4,4,4',4'-Tetramethyl 2,2'-spirobichroman-6,7,6',7'-tetrol tetra-1,2-naphthoquinonediazide-5-sulfonate, 4,4,4',4'-Tetramethyl-2,2'-spirobichroman-6,7,6',7'-tetrol tri-1,2-naphthoquinonediazide-5-sulfonate, 7,7'-Dichloro-4,4,4',4'-tetramethyl-2,2'-spirobichroman-6,6'-diol di-1,2-naphthoquinonediazide-5sulfonate, 6,6'-Tert-butyl-4,4,4',4'-tetramethyl-2,2'-spirobichroman-7,7'-diol di-1,2-naphthoquinonediazide-5-sulfonate, 5,5'-Dichloro 4,4,7,4',4',7'-hexamethyl-2,2'-spirobichroman-6,6'-diol di-1,2-naphthoquinonediazide-5-sulfonate, 5,5'-Dichloro-4,4,7,4',4',7'-hexamethyl 2,2'-spirobichroman-6,6'-diol mono-1,2-naphthoquinonediazide-5-sulfonate, 3,3,3',3'-Tetramethyl-1,1'-spirobiindane-5,6,7,5',6',7'-hexol hexa-1,2-naphthoquinonediazide-4-sulfonate, 3,3,3',3'-Tetramethyl-1,1'-spirobiindane-5,6,7,5',6',7'-hexol tetra-1,2-naphthoquinonediazide-4-sulfonate, 3,3,3',3'-Tetramethyl-1,1'-spirobiindane-5,6,7,5',6',7'-hexol di-1,2-naphthoquinonediazide-4-sulfonate, 3,3,3',3'-Tetramethyl-1,1'-spirobiindane-4,6,7,4',6',7'-hexol penta-1,2-naphthoquinonediazide-4-sulfonate, 3,3,3',3'-Tetramethyl-1,1'-spirobiindane-4,6,7,4',6',7'-hexol tetra-1,2-naphthoquinonediazide-4-sulfonate, 3,3,3',3'Tetramethyl-1,1'-spirobiindane-5,6,5',6'-tetrol tetra-1,2-naphthoquinonediazide-4-sulfonate, 3,3,3',3'-Tetramethyl-1,1'-spirobiindane-5,6,5',6'-tetrol tri-1,2-naphthoquinonediazide-4-sulfonate, 3,3,3',3'-Tetramethyl-1,1'-spirobiindane-6,7,6',7'-tetrol tetra-1,2-naphthoquinonediazido-4-sulfonate, 3,3,3',3'-Tetramethyl-1,1'-spirobiindane-6,7,6',7'-tetrol tri-1,2-naphthoquinonediazido-4-sulfonate, 5,5'-Di-tert-butyl-3,3,3',3'-tetramethyl-1,1'-spirobiindane-6,7,6',7'-tetrol tetra 1,2-naphthoquinonediazide-4-sulfonate, 5,5'-Di-tert-butyl-3,3,3',3'-tetramethyl-1,1'-spirobiindane-6,7,6',7'-tetrol di-1,2-naphthoquinonediazido-4-sulfonate, 5-Tert-butyl-3,3,3',3'-tetramethyl-1,1'-spirobiindane-6,7,6',7'-tetrol tri-1,2-naphthoquinonediazide-4-sulfonate, 5-Tert-butyl-3,3,3',3'-tetramethyl-1,1'-spirobiindane-6,7,6',7'-tetrol mono-1,2-naphthoquinonediazide-4-sulfonate, 3,3,3',3'-Tetramethyl-1,1'-spirobiindane-5,6,6'-triol tri-1,2-naphthoquinonediazide-4-sulfonate, 3,3,3',3'-Tetramethyl-1,1'-spirobiindane-6,6'-diol di-1,2-naphthoquinonediazide-4-sulfonate, 5,5'-Di tert-butyl 3,3,3',3'-tetramethyl 1,1'-spirobiindane-6,6'-diol di-1,2-naphthoquinonediazide-4-sulfonate, 3,3,3',3'-Tetramethyl-1,1'-spirobiindane-5,5'-diol di-1,2-naphthoquinonediazide-4-sulfonate, 3,3,3',3'-Tetramethyl-1,1'-spirobiindane-6,6'-diol di-1,2-naphthoquinonediazide-4-sulfonate, 7,7'-Dibromo-3,3,5,3',3',5'-hexamethyl-1,1'spirobiindane-6,6'-diol di-1,2-naphthoquinonediazide-4-sulfonate, 1,1'-Spirobiindane-5,5'-diol di-1,2-naphthoquinonediazide-4-sulfonate, 5,5'-Diamino-3,3,3',3'-tetramethyl-1,1'-spirobiindane-1,2-naphthoquinonediazide-4-sulfonic acid diamide, 5,5'-Diamino-3,3,3',3'-tetramethyl-1,1'-spirobiindane-1,2-naphthoquinonediazide-4-sulfonic acid monoamide, 4,4,4',4'-Tetramethyl-2,2'-spirobichroman-6,7,6',7'-tetrol tetra-1,2-naphthoquinonediazide-4-sulfonate, 4,4,4',4'-Tetramethyl-2,2'-spirobichroman-6,7,6',7'-tetrol tri-1,2-naphthoquinonediazide-4-sulfonate, 7,7'-Dichloro-4,4,4',4'-tetramethyl-2,2'-spirobichroman-6,6'-diol di-1,2-naphthoquinonediazide-4-sulfonate, 6,6'-Tert-butyl-4,4,4',4'-tetramethyl-2,2'-spirobichroman-7,7'-diol di-1,2-naphthoquinonediazide-4-sulfonate, 5,5'-Dichloro-4,4,7,4',4',7'-hexamethyl-2,2'-spirobichroman-6,6'-diol di-1,2-naphthoquinonediazide-4-sulfonate.

As the alkali-soluble resin to be used in the present invention, a novolak resin, a vinylphenol resin, an N-(hydroxyphenyl)maleimide (co)polymer, a styrene-maleic anhydride copolymer, a methacrylic or acrylic resin containing a carboxyl group, a sulfonyl group, or a phosphonic acid group, fr example, and the like can be used.

The alkali-soluble novolak resin is obtained by polycondensing a phenol-base monomer and 0.6 to 1.0 mol of an aldehyde-base monomer per mol of the phenol-base monomer in the presence of an acidic catalyst. As the phenol-base monomer, phenol, p-chlorophenol, o-cresol, m-cresol, p-cresol, ethylphenol, resorcinol, naphthol, xylenol and the like can be used alone or in combination with one another. As the aldehyde-base monomer, formaldehyde, paraformaldehyde, acetoaldehyde, furfural and the like can be used alone or in combination with one another. As the acidic catalyst, hydrochloric acid, sulfuric acid, formic acid, oxalic acid acetic acid and the like can be used. The novolak resin having a molecular weight of 1,000 to 50,000 as obtained above is alkali-soluble.

The amount of the light-sensitive substance used can be in the range of from about 5 to about 100 parts by weight and preferably 10 to 50 parts by weight per 100 parts by weight of the alkali-soluble novolak resin. If the amount of the light-sensitive substance used is less than about 5 parts by weight, the film remaining ratio markedly drops. On the other hand, if it is more than about 100 parts by weight, the sensitivity and the solubility in solvents decrease.

In the present invention, the above light-sensitive substance is mainly used. If necessary, conventional light-sensitive substances, for example, ester compounds of polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone, 2,3,4,3',4',5'-hexahydroxybenzophenone and the like, polyhydroxyphenylalkylketones such as 2,3,4-trihydroxyacetophenone, 2,3,4-trihydroxyphenylhexyl ketone and the like, bis((poly)hydroxyphenyl)alkanes such as bis(2,4-dihydroxyphenyl)methane, bis(2,3,4-trihydroxyphenyl)methane, bis(2,4-dihydroxyphenyl)propane-1 and the like, polyhydroxybenzoic acid esters such as propyl 3,4,5-trihydroxybenzoate, phenyl 3,4,5-trihydroxybenzoate and the like, bis(polyhydroxybenzoyl)alkanes or bis(polyhydroxybenzoyl)aryls such as bis(2,3,4-trihydroxybenzoyl)methane, bis(2,3,4-trihydroxybenzoyl)benzene and the like, alkylene di(polyhydroxybenzoate) such as ethylene glycol di(3,5-dihydroxybenzoate) and the like, and 1,2-naphthoquinonediazido-5-sulfonyl chloride can be used in combination with one another. In this case, the amount of the ester compound used in not more than about 100 parts by weight, preferably not more than 30 parts by weight per 100 parts by weight of the light-sensitive substance of the formula (A).

In order to accelerate the dissolution in the developer, polyhydroxy compounds can be incorporated. Preferred examples of such polyhydroxy compounds are phenols, resorcin, phloroglucinol, 2,3,4-trihydroxybenzophenone, 2,3,4,4'-tetrahydroxybenzophenone, 2,3,4,3',4',5'-hexahydroxybenzophenone, an acetonepyrogallol condensed resin and the like.

As the solvent to dissolve the light-sensitive substance and the alkali-soluble resin, ketones such as methyl ethyl ketone, cyclohexanone and the like, alcohol ethers such as ethylene glycol monomethyl ether, ethylene glycol monoethyl ether and the like, ethers such as dioxane, ethylene glycol dimethyl ether, diethylene glycol dimethyl ether and the like, cellosolve esters such as methylcellosolve acetate, ethylcellosolve acetate and the like, aliphatic acid esters such as butyl acetate, ethyl lactate, methyl lactate and the like, halogenated hydrocarbons such as 1,1,2-trichloroethylene and the like, and high polar solvents such as dimethylacetamide, N-methylpyrrolidone, dimethylformamide, dimethyl sulfoxide, γ-butyrolactone and the like can be used alone or as a combinaiton theeof.

In the photoresist composition of the present invention, if necessary, a dye, a plasticizer, an adhesive aid, a surfactant and the like can be incorporated. Representative examples are dyes such as methyl violet, crystal violet, marachite green and the like, plasticizers such as stearic acid, an acetal resin, a phenoxy resin, an alkyd resin and the like, adhesive aids such as hexamethyldisilazane, chloromethyl silane and the like, and surfactants such as nonylphenoxy poly(ethyleneoxy)ethanol, octylphenoxy poly(ethyleneoxy)ethanol and the like. In addition, the compounds described in JP-A No. 58-149042 and JP-A No. 58-182633 may be added.

The above photoresist composition is coated on a substrate (e.g., silicone/silicon dioxide coated) as used in fabrication of integrated circuit elements by a suitable coating method using a spinner, a coater and the like, and then exposed to light through a suitable mask and developed whereupon a good resist is obtained. The thickness of the coated films is usually from about 0.1 to about 20 μm, preferably from 0.5 to 5 μm.

As the developer for the photoresist composition of the present invention, aqueous solutions of alkalis, for example, inorganic alkalis such as sodium hydroxide, potassium hydroxide, sodium carbonate, sodium silicate, sodium metasilicate, ammonia water and the like, primary amines such as ethylamine, n-propylamine and the like, secondary amines such as diethylamine, di-n-butylamine and the like, tertiary amines such as triethylamine, methyldiethylamine and the like, alcoholamines such as dimethylethanolamine, triethanolamine and the like, quaternary ammonium salts such as tetramethylammonium hydroxide, tetraethylammonium hydroxide and the like, and cyclic amines such as pyrrole, piperidine and the like can be used. To the above alkalis, suitable amounts of alcohols and surfactants can be added.

If necessary, by applying an image reversion processing to the light-sensitive resin composition the present invention by the method described in British Pat.No. 844,039, U.S. Pat. No. 4,104,070, and JP-B No. 55-32088, a negative image can be obtained.

The photoresist of the present invention is excellent in resolving power, fidelity reproducibility, cross-sectional shape of the resist image, developing latitude, sensitivity and heat resistance, and the solution of the photoresist of the present invention in a commonly used solvent is excellent in long-term storage stability.

EXAMPLES

The present invention is described in greater detail with reference to the following examples although it is not limited thereto. In the examples, all percents, ratios, etc., are by weight unless otherwise indicated.

(1) Preparation of Light-Sensitive Substance (a)

42 g of pyrogallol, 33 g of acetone, 80 ml of acetic acid and 64 ml of concentrated hydrochloric acid were placed in a three-necked flask and uniformly dissolved by stirring. The resulting solution was heated on a water bath, refluxed for 24 hours and then cooled to room temperature. After cooling, the reaction solution was added dropwise to 2,000 ml of distilled water, and the precipitated product was filtered off and dried under reduced pressure.

4 g of 3,3,3',3'-tetramethyl-1,1'-spirobiindane-5,6,7,5',6',7'-hexol as obtained above, 13 g of 1,2 naphthoquinonediazide-5-sulfonyl chloride, and 300 ml of acetone were placed in a three-necked flask and uniformly dissolved by stirring. Then a mixture of 4.9 g of triethylamine and 30 ml of acetone was gradually added dropwise and reacted at room temperature for 3 hours. After the completion of the reaction, the contents were added dropwise to a 1% aqueous hydrochloric acid solution, and the precipitate thus formed was filtered off and dried under reduced pressure to obtain a light-sensitive substance (a).

(2) Preparation of Light-Sensitive Substance (b)

3,3,3',3'-Tetramethyl-1,1'-spirobiindane-5,6,5',6'-tetrol was prepared from pyrocatechol and acetone in the same manner as for the light-sensitive substance (a).

4 g of 3,3,3',3'-tetramethyl-1,1'-spirobiindane-5,6,5',6'-tetrol as obtained above, 9.5 g of 1,2-naphthoquinonediazide-5-sulfonyl chloride, and 300 ml of acetone were placed in a three-necked flask and uniformly dissolved by stirring.

Then a mixture of 3.6 g of triethylamine and 30 ml of acetone was gradually added dopwise and reacted at room temperature for 3 hours.

After the completion of the reaction, the contents were added dropwise to a 1% aqueous hydrochloric acid solution and the precipitate thus formed was filtered off and dried under reduced pressure to obtain a light-sensitive substance (b).

(3) Preparation of Light-Sensitive Substance (c)

4,4,4',4'-Tetramethyl-2,2'-spirobichroman-6,7,6',7'-tetrol was prepared from 1,2,4-triacetoxybenzene and acetone in the same manner as for the light-sensitive substance (a).

5 g of 4,4,4',4'-tetramethyl-2,2'-spirobichroman-6,7,6',7'-tetrol obtained above, 10.8 g of 1,2-naphthoquinonediazido-5-sulfonyl chloride and 300 ml of acetone were placed in a three-necked flask and uniformly dissolved by stirring. Then, a mixture of 4.1 g of triethylamine and 30 cm$^3$ of acetone was gradually added dropwise and reacted at room temperature for 3 hours. After the completion of the reaction, the contents were added dropwise to a 1% aqueous hydrochloric acid solution and the precipitate formed was filtered and dried under reduced pressure to obtain a light-sensitive substance (c).

(4) Preparation of Novolak Resin 45 g methacresol, 55 g of p-cresol, 54.0 g of a 37% aqueous formalin solution and 0.05 g of oxalic acid were placed in a three-necked flask and reacted for 7 hours by raising the temperature to 100° C. while stirring. After the completion of the reaction, the reaction mixture was cooled to room temperature and reduced in pressure to 30 mmHg. Then the mixture was gradually heated to 150° C., and water and unreacted monomers were removed. The novolak resin thus obtained has an average molecular weight of 8,300 (calculated as polystyrene).

EXAMPLE 1

3.04 g of the light-sensitive substance (a) obtained in (1) above and 12.08 g of the novolak resin obtained in (4) above were dissolved in 40.88 g of ethoxyethyl acetate and passed through a 0.2 μm microfilter to prepare a resist composition.

The resist composition thus prepared was coated on a silicone wafer having an oxide coating 2,500 Å thick by the use of a spinner and dried at 90° C. for 30 minutes in a nitrogen atmosphere in a counter-current oven to obtain a resist film having a thickness of 1.5 μm. This resist film was exposed to light through a test chart mask by the use of a reduction projection exposing apparatus (manufactured by Nikon Co., Ltd.) and developed with a 2.38% aqueous solution of tetramethylammonium hydroxide for one minute and, thereafter, rinsed with ion exchanged water to obtain a resist pattern. The resist pattern thus obtained was evaluated by observation with a scanning type electron microscope. The sensitivity was determined as the reciprocal of exposure amount to reproduce a mask pattern of 2.0 μm in width and indicated as a relative value with that of Comparative Example 1 as a base. The film remaining ratio was indicated as a percentage of film thickness of unexposed area after development to film thickness before development.

The heat resistance was indicated by the temperature at which deformation of the resist pattern began when a silicone wafer carrying thereon the resist pattern was baked for 4 minutes at various temperatures on a vacuum adsorption type hot plate. The resolving power was indicated by the line width of the minimum mask pattern resolved at an exposure amount sufficient to reproduce a mask pattern of 2.0 μm width.

The relative sensitivity was 1.10, the remaining film ratio was 99.5%, the heat resistance was 150° C., and the resolving power was 0.7 μm.

EXAMPLES 2 TO 4

Resist composition were prepared using the light-sensitive substances prepared in (2) and (3) above in the proportions shown in Table 1 and evaluated in the same manner as in Example 1. The results are shown in Table 2.

TABLE 1

| Example | Light-Sensitive Substance | Novolak Resin | Solvent |
|---|---|---|---|
| 2 | Light-sensitive Substance (b), 2.98 g | 12.14 g | Same as in Example 1, 40.88 g |

TABLE 1-continued

| Example | Light-Sensitive Substance | Novolak Resin | Solvent |
|---|---|---|---|
| 3 | Light-sensitive Substance (c), 2.74 g | 12.38 g | Ethyl lactate 41.65 g |
| 4 | Light-sensitive Substance (c), 1.56 g | 7.08 g | Same as in Example 1, 23.37 g |

TABLE 2

| Example | Relative Sensitivity | Resolving Power | Film Remaining Ratio | Heat Resistance |
|---|---|---|---|---|
| 2 | 1.3 | 0.7 | 99.5 | 145 |
| 3 | 1.0 | 0.7 | 99.8 | 145 |
| 4 | 0.8 | 0.6 | 99.8 | 145 |

EXAMPLES 5 AND 6

Resist composition were prepared using the light-sensitive substance (a) or (b), a cresol-novolak resin (molecular weight of 18,300 calculated as polystyrene) prepared from 60% by weight of m-cresol, by weight of p-cresol and formalin, and a solvent in the proportions shown in Table 3 and evaluated in the same manner as in Example 1. The results are shown in Table 4.

TABLE 3

| Example | Light-Sensitive Substance | Novolak | Solvent |
|---|---|---|---|
| 5 | Light-sensitive Substance (a), 2.59 g | 8.21 g | Ethoxyethyl acetate, 29 g |
| 6 | Light-sensitive Substance (b), 2.48 g | 8.32 g | Same as in Example 1, 29.2 g |

TABLE 4

| Example | Relative Sensitivity | Resolving Power | Film Remaining Ratio | Heat Resistance |
|---|---|---|---|---|
| 5 | 1.4 | 0.8 | 99.8 | 165 |
| 6 | 1.5 | 0.8 | 99.6 | 160 |

As can be seen from the above results, the photoresist of the present invention is excellent in sensitivity, resolving power, film remaining ratio and heat resistance. Even though the photoresist solution of the present invention was allowed to stand at 40° C. for 30 days, no precipitation was observed in the resist solution.

COMPARATIVE EXAMPLES 1 AND 2

Resist solutions were prepared using the light-sensitive substances, the cresol-novolak resins and the solvents shown in Table 5 and evaluated in the same manner as in Example 1. The results are shown in Table 6. In Comparative Example 1, even though the resist solution was allowed to stand at 40° C. for 30 days, no precipitation was observed in the resist solution. In Comparative Example 2, the formation of precipitate was observed in the resist solution.

TABLE 5

| Comparative Example | Light-Sensitive Substance | Resin | Solvent |
|---|---|---|---|
| 1 | 2,3,4-Trihydroxybenzophenone 1,2-naphthoquinonediazide-5-sulfonate, 3.92 g | Same as in Example 1, 10.08 g | Ethoxyethyl acetate, 36 g |
| 2 | 2,3,3',4'-Tetrahydroxybenzophenone 1,2-naphthoquinonediazide-5- | Same as in Example 1, | Ethyl lactate, 36.5 g |

TABLE 5-continued

| Comparative Example | Light-Sensitive Substance | Resin | Solvent |
|---|---|---|---|
| | sulfonate, 2.84 g | 10.66 g | |

TABLE 6

| Comparative Example | Relative Sensitivity | Resolving Power | Film Remaining Ratio | Heat Resistance |
|---|---|---|---|---|
| 1 | 1.0 | 0.8 | 99.0 | 135 |
| 2 | 1.1 | 0.8 | 98.8 | 140 |

While the invention has been described in detail and with reference to specific embodiments thereof, it will be apparent to one skilled in the art that various changes and modifications can be made therein without departing from the spirit and scope thereof.

What is claimed is:

1. A light sensitive resin composition comprising a light-sensitive substance represented by the formula (A) shown below and an alkali-soluble resin:

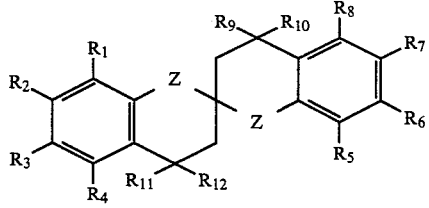

(A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group, -OD, or

(wherein R is hydrogen, or an alkyl group, and D is a 1,2-naphthoquinonediazido-5-sulfonyl group or a 1,2-naphthoquinonediazido-4-sulfonyl group);

$R_9$ to $R_{12}$ are independently hydrogen or a lower alkyl group; and

Z is oxygen or a single bond; provided that at least one of $R_1$ to $R_8$ is -OD or

2. A light-sensitive resin composition as claimed in claim 1, wherein the total number of -OD and

present in the light-sensitive substance represented by the formula (A) is at least 2.

3. A light-sensitive resin composition as claimed in claim 2, wherein the total number of -OD and

present in the light-sensitive substance represented by the formula (A) is at least 4.

* * * * *